(12) United States Patent
Goundar et al.

(10) Patent No.: US 7,238,393 B2
(45) Date of Patent: *Jul. 3, 2007

(54) METHOD OF FORMING SILICON CARBIDE FILMS

(75) Inventors: Kamal Kishore Goundar, Tama (JP); Tadashi Kumakura, Tama (JP); Kiyoshi Satoh, Tama (JP)

(73) Assignee: ASM Japan K.K., Tokyo (JP)

( * ) Notice: Subject to any disclaimer, the term of this patent is extended or adjusted under 35 U.S.C. 154(b) by 55 days.

This patent is subject to a terminal disclaimer.

(21) Appl. No.: 10/414,467

(22) Filed: Apr. 14, 2003

(65) Prior Publication Data

US 2004/0161535 A1    Aug. 19, 2004

Related U.S. Application Data

(63) Continuation-in-part of application No. 10/365,924, filed on Feb. 13, 2003, now abandoned.

(51) Int. Cl.
*B05D 1/04* (2006.01)
(52) U.S. Cl. ............ 427/458; 427/573; 427/574; 427/577; 427/578
(58) Field of Classification Search ............ 427/458, 427/595, 573, 574, 577, 578
See application file for complete search history.

(56) References Cited

U.S. PATENT DOCUMENTS

| | | | | |
|---|---|---|---|---|
| 5,500,102 A | * | 3/1996 | Ichikawa et al. | 204/192.25 |
| 5,800,878 A | * | 9/1998 | Yao | 427/573 |
| 5,888,414 A | * | 3/1999 | Collins et al. | 216/68 |
| 5,983,828 A | * | 11/1999 | Savas | 118/723 I |
| 6,100,184 A | | 8/2000 | Zhao et al. | |
| 6,129,806 A | * | 10/2000 | Kaji et al. | 156/345.46 |
| 6,140,226 A | | 10/2000 | Grill et al. | |
| 6,177,364 B1 | | 1/2001 | Huang | |
| 6,187,691 B1 | | 2/2001 | Fukuda et al. | |
| 6,211,077 B1 | | 4/2001 | Shimizu et al. | |
| 6,211,092 B1 | | 4/2001 | Tang et al. | |
| 6,235,112 B1 | | 5/2001 | Satoh | |
| 6,242,278 B1 | | 6/2001 | Shimizu et al. | |
| 6,277,201 B1 | | 8/2001 | Nishikawa | |
| 6,287,990 B1 | | 9/2001 | Cheung et al. | |
| 6,340,435 B1 | * | 1/2002 | Bjorkman et al. | 216/72 |
| 6,358,573 B1 | * | 3/2002 | Raoux et al. | 427/578 |

(Continued)

FOREIGN PATENT DOCUMENTS

EP        0 771 886 A1        5/1997

(Continued)

*Primary Examiner*—Bret Chen
(74) *Attorney, Agent, or Firm*—Knobbe, Martens, Olson & Bear LLP

(57) ABSTRACT

A method for depositing a silicon carbide layer onto a substrate comprises providing a silicon and carbon source gas and an inert gas into a reaction zone. The reaction zone contains the substrate. The method further comprises producing an electric field in the reaction zone. The electric field is generated using low and high frequency RF energy produced by an RF power supply. The RF power supply generates power at an electrode surface used for plasma discharge in the reaction zone. The method further comprises reacting the silicon and carbon source gas to deposit a silicon carbide film on the substrate. The RF power supply generates high energy RF power and low energy RF power during a processing period.

19 Claims, 8 Drawing Sheets

U.S. PATENT DOCUMENTS

| Patent No. | Date | Inventor | Ref |
|---|---|---|---|
| 6,383,900 B1 | 5/2002 | Shimizu et al. | |
| 6,417,092 B1 | 7/2002 | Jain et al. | |
| 6,465,366 B1 * | 10/2002 | Nemani et al. | 438/778 |
| 6,524,955 B2 | 2/2003 | Fukuda et al. | |
| 6,537,928 B1 | 3/2003 | Matsuki et al. | |
| 6,541,367 B1 * | 4/2003 | Mandal | 438/622 |
| 6,576,564 B2 | 6/2003 | Agarwal | |
| 6,589,888 B2 | 7/2003 | Nemani et al. | |
| 6,593,247 B1 | 7/2003 | Huang et al. | |
| 6,627,532 B1 | 9/2003 | Gaillard et al. | |
| 6,627,535 B2 | 9/2003 | Macneil et al. | |
| 6,668,752 B2 | 12/2003 | Yao | |
| 6,706,142 B2 * | 3/2004 | Savas et al. | 156/345.48 |
| 6,759,327 B2 | 7/2004 | Xia et al. | |
| 6,777,349 B2 | 8/2004 | Fu et al. | |
| 6,815,332 B2 * | 11/2004 | San et al. | 438/623 |
| 7,189,658 B2 * | 3/2007 | Lakshmanan et al. | 438/758 |
| 2001/0030369 A1 | 10/2001 | MacNeil et al. | |
| 2001/0031563 A1 | 10/2001 | Shioya et al. | |
| 2001/0051445 A1 | 12/2001 | Shioya et al. | |
| 2002/0027286 A1 | 3/2002 | Sundararajan et al. | |
| 2002/0054962 A1 | 5/2002 | Huang | |
| 2002/0142578 A1 | 10/2002 | Xia et al. | |
| 2004/0126929 A1 * | 7/2004 | Tang et al. | 438/118 |

FOREIGN PATENT DOCUMENTS

| | | |
|---|---|---|
| EP | 0 926 715 A2 | 6/1999 |
| EP | 1191123 A2 * | 3/2002 |
| JP | 2001-060584 | 6/2001 |

* cited by examiner

METHOD OF FORMING SILICON CARBIDE FILMS

PRIORITY APPLICATION

This application is a continuation-in-part of U.S. patent application Ser. No. 10/365,924, filed on 13 Feb. 2003 now abandoned.

FIELD OF THE INVENTION

The present invention relates to silicon carbide layers and, more particularly to a method of forming low dielectric constant and low leakage current silicon carbide layers.

BACKGROUND OF THE INVENTION

Integrated circuits have evolved into complex devices that include multiple levels of metal layers to electrically interconnect discrete layers of semiconductor devices on a single semiconductor chip. Recently, with the evolution of higher integration and higher density of integrated circuit components, the demand for greater speed of the data transfer rate is required. For this reason, an insulating film having low leakage current, low dielectric constant to give the small RC delay is employed.

As the dimensions of the integrated circuit components are becoming increasingly denser, the materials used to fabricate such components contribute to the electrical performance of such components. One way to reduce the size of interconnection lines and vias is to change the wiring materials from the conventional aluminum (Al) to copper (Cu) wiring having low electric resistance.

However, to produce a semiconductor device having multi-layered copper wiring, a low dielectric constant insulating layer is formed as the interlayer insulating film on the copper wiring.

Furthermore, the use of copper as the interconnect material has various problems. For example, copper is easily diffused into the low dielectric constant insulating film from the copper wiring, thus increasing the leakage current between the upper and lower wiring.

The use of silicon carbide films as copper diffusion barrier layers has been published in U.S. Pat. No. 5,800,878. The dielectric constant of this film is such as about 5, and in addition it is used as copper diffusion barrier layers for 130 nm-nodes Large Scale Integration (LSI) technologies where the dielectric constant of the interlayer dielectric film is 3.

For next generation, 100 nm/65 nm-nodes Ultra Large Scale Integration (ULSI) technologies, the reduction of interconnect capacitance is important for suppressing the signal delay as well as the power consumption. Interlayer dielectric films with dielectric constant less than 2.5 are used with copper damascene structures. To decrease the effective dielectric of fine pitched lines, further reduction in the dielectric constant is necessary not only for the inter layer dielectric film itself but also the supporting dielectric films such as hard mask, etch stop layers and copper diffusion barrier layers. Furthermore, to prevent the migration of metal atoms the leakage current of such film at 1 MV/cm has to be less than that of $1\times10^{-8}$ A/cm$^2$. Silicon carbide films with dielectric constant less than 4.5 such that the leakage current at 1 MV/cm is less than $1\times10^{-8}$ A/cm$^2$ are suggested to be suitable to substitute for as such films.

The method of forming Nitrogen doped silicon carbides (SiCN), oxygen doped silicon carbides (SiCO) has been published in U.S. Patent Application Publication 2001/0030369, U.S. Patent Application Publication 2002/0027286, U.S. Patent Application Publication 2001/0051445, and U.S. Patent Application Publication 2001/0031563. Furthermore; these films have been proposed as copper diffusion barrier layers. Though a nitrogen doped silicon carbide layer has been proposed as a copper diffusion barrier layer with low leakage current, its dielectric constant is 4.5 to 5.0 and this results in significant increases in the effective dielectric of the total dielectric stacks.

In case of oxygen doped silicon carbide, although its dielectric constant is relatively low, such as less than 5, it cannot sufficiently refrain from increasing the leakage current. To decrease the leakage current to a sufficient level, the oxygen must be introduced much more into the silicon carbide film.

However, to do so, the leakage current can be reduced up to a satisfactory level, nevertheless a new problem is caused such that the surface of the copper wiring is oxidized and thus the barrier insulating film and the inter dielectric layer is ready to peel.

Silicon carbide has also been suggested for use of barrier layer on integrated circuits, since silicon carbides can have a low dielectric constant.

However, the dielectric constant and stress of the conventional silicon carbide film drifts when it is directly exposed to air. This is due to the oxidation of the top surface of the silicon carbide film. The method to minimize the oxidation of carbon containing materials, such as silicon carbide, with an inert gas plasma such as helium (He), Argon (Ar) is published in U.S. Patent Application Publication 2001/0060584. This inert gas plasma treatment only minimizes the top surface of the silicon carbide film from getting oxidized, however, no changes/improvements to the film properties are observed.

Furthermore, although the dielectric constant is relatively low, such as 4.0, the conventional SiC barrier insulating film cannot sufficiently suppress the increase in the leakage current. In this case, to enough suppress the leakage current, a new method is desired that can produce a barrier layer that is effective in preventing the migration of metal atoms while also exhibiting low dielectric constant and low leakage current.

SUMMARY OF THE INVENTION

Thus, it is desired to develop a new method of forming etch stop layers and copper diffusion barrier layers that can be employed in the next generation, 100 nm/65 nm-nodes Ultra Large Scale Integration (ULSI) technologies, where the copper damascene structures are used.

The main characteristics of etch stop layers and copper diffusion barrier layers such as silicon carbide films (SiC), nitrogen doped silicon carbide films (SiCN) and oxygen doped silicon carbide films (SiCO) developed using various embodiments of the present invention are as follows:

a) The dielectric constant is less than 4.5.
b) No changes to its film properties such as changes to the film stress or changes to film dielectric constant are observed even when directly exposed to air at a room temperature between 20° C. to 30° C.
c) The leakage current at 1 MV/cm is extremely low, such as less than $1\times10^{-7}$ A/cm$^2$.
d) The etch selectivity of SiC to SiOC (as intermediate dielectric), SiCN to SiOC and SiCO to SiOC is higher than 3.

According to one preferred embodiment of the present invention, a method of forming low dielectric constant and low leakage current silicon carbide film for use in integrated circuit fabrication processes is provided. The silicon carbide film is deposited on a substrate by introducing alkyl silicon compounds such as divinyl-dimethylsilane ($Si(CH=CH_2)_2(CH_3)_2$), tri-methylsilane ($SiH(CH_3)_3$) or tetra-methylsilane ($Si(CH_3)_4$) referred to herein as TMS and an inert gas such as argon (Ar), helium (He), krypton (Kr), neon (Ne) or xenon (Xe) in the presence of an electric field in a plasma CVD reactor.

Silicon carbide based films such as SiCN and SiCO, desired for hard mask, etch stop, or copper diffusion barrier layers, are formed by the plasma enhanced CVD method using the film forming gas containing alkyl silicon compounds and an additional gas such as $NH_3$ and $CO_2$ respectively. In addition, $O_2$, $O_3$, $CH_3OH$, $C_2H_5OH$ or $H_2O$ can be used as an additional gas in forming SiCO films. An inert gas commonly employed is He or Ar.

A mixture of high and low frequency RF power, such that high frequency RF power is in the range of 13.56 MHz to 30 MHz and low frequency RF power is in the range of 200 kHz to 500 kHz, wherein the ratio of low frequency to total power is less than about 0.5, generates the electric field. The leakage current and dielectric constant of the silicon carbide in this invention is decreased by introducing excess amount of inert gas and by invoking a pulsing operation to the RF generator during deposition.

DETAILED DESCRIPTION OF THE PREFERRED EMBODIMENTS

Disclosed herein is a method for depositing a silicon carbide film having a low dielectric constant and low leakage current onto a substrate in a CVD chamber, comprising; providing a silicon source, carbon source, and an inert gas in a reaction zone containing a substrate, and reacting the silicon and carbon source in the presence of a plasma to deposit a low dielectric constant and low leakage current silicon carbide film on the substrate.

A mixture of high and low frequency RF power generates the electric field, wherein the ratio of low frequency to total power is less than about 0.5. The leakage current and dielectric constant in the resulting silicon carbide film is directly related to the carbon concentration, to the amount of inert gas introduced and to the pulse operation of the RF generator during deposition.

Silicon Carbide Layer Formation

In one preferred embodiment of the present invention, a silicon carbide layer is formed by reacting a gas mixture including, silicon source, carbon source and an inert gas into a plasma enhanced chemical vapor deposition (PECVD) chamber. Details of the processing system are illustrated in FIG. 1.

Figure 1:
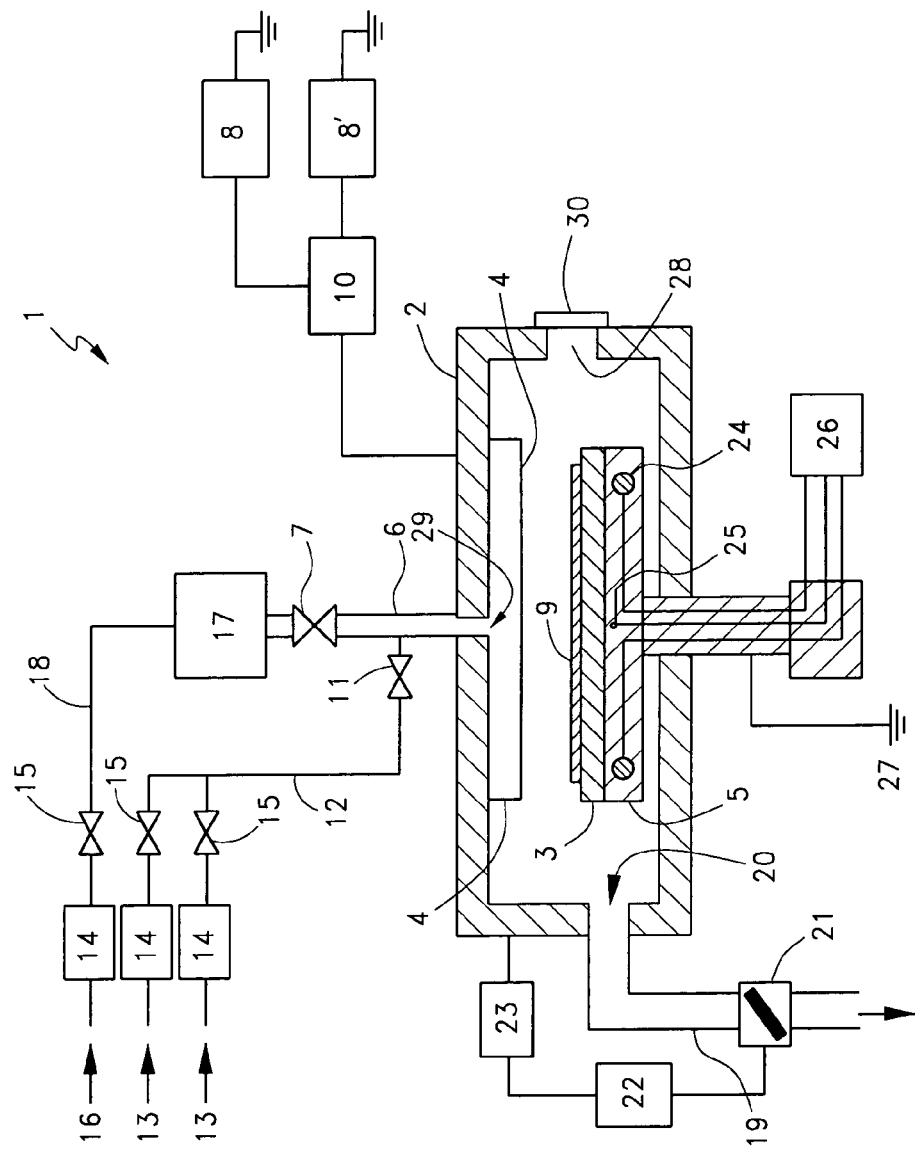
FIG. 1 is a schematic cross-sectional view of an exemplary plasma chemical vapor deposition device.

FIG. 1 is a schematic cross section of an exemplary plasma CVD device according to a preferred embodiment. A plasma CVD device 1, which is used to form a thin film on a semiconductor wafer 9 or other substrate, comprises a reaction chamber 2, a support 3 provided within the reaction chamber to support the semiconductor wafer 9, a showerhead 4 that is positioned to face the support 3 and is used to jet out reaction gas uniformly onto the semiconductor wafer 9, an outlet 20 to exhaust reaction gases and byproducts from the reaction chamber 2, and a remote plasma discharge chamber 13. The remote plasma discharge chamber 13 is positioned remotely from reaction chamber 2 and is linked to the showerhead 4 via piping 14 and valve 15. The remote plasma discharge chamber 13 has characteristics wherein it generates active species using radio-frequency oscillating output energy of the designated frequency and the piping 14 is made of materials that are not corroded by the active species.

The support 3 that is provided within the reaction chamber 2 and that is used to place the semiconductor wafer 9 is made of anodized aluminum of aluminum alloy and is grounded 27 to constitute one side of an electrode of plasma discharge. The reaction chamber 2 of the illustrated embodiment is thus a plasma CVD chamber configured for in situ (in chamber) plasma generation. Within the illustrated support 3, a ring-shape heating element 26 is embedded and the semiconductor wafer's temperature is controlled at a predetermined temperature using a temperature controller (not shown). The support 3 is connected to a driving mechanism 25 that moves the support 3 up and down through a support piston 29.

Within the reaction chamber 2, the showerhead 4 is provided at a position facing the support 3. In the showerhead 4, thousands of fine holes are provided to inject reaction gas onto the semiconductor wafer 9. The showerhead is electrically connected to a radio-frequency oscillator 8 and 8' via matching circuit 10 and constitutes another electrode for plasma discharge. To bring reaction gas to be used for film formation from the showerhead 4, a reaction gas conduit 11 is connected to the piping 14. The number of the gas conduits 11 is not limited to one. According to the type of reaction gas, any number of gas conduits can be installed. One end of the gas conduit 11 constitutes a gas inlet port 5 to cause reaction gas to flow in and the other end constitutes a reaction gas exit port 7 to cause gas to flow out to the showerhead 4. In the middle of the reaction gas conduit 11, a mass flow controller (not shown) and valve 6 are positioned.

On the side wall of the reaction chamber 2, an outlet 20 is provided. The outlet 20 is connected to a vacuum exhaust pump (not shown) through piping 17. Between the outlet 20 and the vacuum pump, a conductance-controlling valve 21 is provided to regulate pressure within the reaction chamber 2. The conductance-controlling valve 21 is electrically connected to an external regulator. Additionally, a pressure gauge 28a is preferably provided to measure pressure within the reaction chamber 2. This pressure gauge is electrically connected to the regulator 28.

The silicon and carbon source may be an alkyl silicon compound having a general formula $Si_xC_yH_z$, where x has a range from 1 to 2, y has a range from 1 to 6, and z has a range from 6 to 20. For example, divinyl-dimethylsilane, tri-methylsilane, and tetra-methylsilane among others maybe used as the alkyl silicon compound. Helium (He), argon (Ar), neon (Ne), krypton (Kr) and xenon (Xe) maybe used for the inert gas.

The process of forming a silicon carbide film on a 200 mm silicon wafer is explained as follows. In general, the following deposition process parameters can be used to form the silicon carbide layer. The process parameters range from a substrate temperature of about 200° C. to about 400° C. (more preferably 320-350° C.), a chamber pressure of about 300 Pa to 1000 Pa, an alkyl silicon compound flow rate of about 100 sccm to 1000 sccm, an inert gas flow rate of about 200 sccm to 5000 sccm such that the ratio of the inert gas flow rate to alkyl silicon compound is in the range of about 1:1 to about 1:10; and a mixed frequency RF power having at least a first RF power with a frequency in a range of about 13 MHz to 30 MHz (high frequency); and with a power in a range of about 100 Watts to 2000 Watts, and at least a second RF power with a frequency in a range of about 100 kHz to 500 kHz (low frequency); and with a power in the range of about 50 Watts to 500 Watts, wherein the ratio of low frequency to total power is less than about 0.5, and wherein the RF power source generates the electric field. Preferably first RF power is in the range of 300-1000W and second RF power is in the range of 50-250W. Second RF power with a frequency in a range of 300 kHz-450 kHz are preferably used for combination with first RF power.

The ratio of the second RF power to the total mixed frequency power is preferably less than about 0.5 to 1.0. The above process parameters provide a deposition rate for the silicon carbide layer in the range of about 100 nm/min to 350 nm/min when implemented on a 200 mm substrate in a deposition chamber.

In addition, during film forming step, the RF power is applied as pulsed energy.

The details on film forming steps, parameters and RF power applied as pulse energy are explained below.

SiCN Film Formation

As an exemplary process for growing SiCN film on a substrate according to the present invention, the parameters listed in TABLES 1 through 3 were used:

TABLE 1

| Parameter | Range |
|---|---|
| Tetra-methylsilane (TMS) flow rate | 100 sccm~1000 sccm |
| Ammonia (NH3) flow rate | 100 sccm~1000 sccm |
| Helium (He) flow rate | 500 sccm~10000 sccm |
| Pressure | 300 Pa~1000 Pa |
| Primary RF Power | 100 W~2000 W |
| Secondary RF Power | 50 W~500 W |
| Substrate Temperature | 200° C.~400° C. |

TABLE 2

| Parameter | Preferred Range |
|---|---|
| Tetra-methylsilane (TMS) flow rate | 200 sccm~500 sccm |
| Ammonia (NH3) flow rate | 100 sccm~500 sccm |
| Helium (He) flow rate | 1000 sccm~3000 sccm |
| Pressure | 300 Pa~1000 Pa |
| Primary RF Power | 100 W~1000 W |
| Secondary RF Power | 50 W~300 W |
| Substrate Temperature | 320° C.~350° C. |

TABLE 3

| Parameter | More Preferred Range |
|---|---|
| Tetra-methylsilane (TMS) flow rate | 200 sccm~300 sccm |
| Ammonia (NH3) flow rate | 200 sccm~300 sccm |
| Helium (He) flow rate | 2000 sccm~3000 sccm |
| Pressure | 350 Pa~700 Pa |
| Primary RF Power | 500 W~700 W |
| Secondary RF Power | 50 W~150 W |
| Substrate Temperature | 320° C.~350° C. |

SiCO Film Formation

As an exemplary process for growing SiCO film on a substrate according to the present invention, the parameters listed in TABLES 4 through 6 were used:

TABLE 4

| Parameter | Range |
|---|---|
| Tetra-methylsilane (TMS) flow rate | 100 sccm~1000 sccm |
| Carbon dioxide (CO2) flow rate | 1000 sccm~10000 sccm |
| Helium (He) flow rate | 500 sccm~10000 sccm |
| Pressure | 300 Pa~1000 Pa |
| Primary RF Power | 100 W~2000 W |
| Secondary RF Power | 50 W~500 W |
| Substrate Temperature | 200° C.~400° C. |

TABLE 5

| Parameter | Preferred Range |
|---|---|
| Tetra-methylsilane (TMS) flow rate | 200 sccm~500 sccm |
| Carbon dioxide (CO2) flow rate | 1000 sccm~5000 sccm |
| Helium (He) flow rate | 1000 sccm~3000 sccm |
| Pressure | 300 Pa~1000 Pa |
| Primary RF Power | 100 W~1000 W |
| Secondary RF Power | 50 W~300 W |
| Substrate Temperature | 320° C.~350° C. |

TABLE 6

| Parameter | More Preferred Range |
|---|---|
| Tetra-methylsilane (TMS) flow rate | 200 sccm~300 sccm |
| Carbon dioxide (CO2) flow rate | 1500 sccm~2500 sccm |
| Helium (He) flow rate | 1000 sccm~2500 sccm |
| Pressure | 300 Pa~700 Pa |
| Primary RF Power | 400 W~600 W |
| Secondary RF Power | 50 W~150 W |
| Substrate Temperature | 320° C.~350° C. |

SiC Film Formation

As an exemplary process for growing SiC film on a substrate according to the present invention, the parameters listed in TABLES 7 through 9 were used:

TABLE 7

| Parameter | Range | |
|---|---|---|
| | Step 1 | Step 2 |
| Tetra-methylsilane (TMS) flow rate | 100 sccm~1000 sccm | 0 sccm~500 sccm |
| Helium (He) flow rate | 100 sccm~10000 sccm | 100 sccm~10000 sccm |
| Pressure | 300 Pa~1000 Pa | 300 Pa~1000 Pa |
| Primary RF Power | 100 W~2000 W | 100 W~2000 W |
| Secondary RF Power | 50 W~500 W | 50 W~500 W |
| Substrate Temperature | 200° C.~400° C. | 200° C.~400° C. |

TABLE 8

| Parameter | Preferred Range | |
|---|---|---|
| | Step 1 | Step 2 |
| Tetra-methylsilane (TMS) flow rate | 100 sccm~700 sccm | 0 sccm~300 sccm |
| Helium (He) flow rate | 100 sccm~3000 sccm | 100 sccm~5000 sccm |
| Pressure | 300 Pa~1000 Pa | 300 Pa~1000 Pa |
| Primary RF Power | 100 W~1000 W | 100 W~1000 W |
| Secondary RF Power | 50 W~300 W | 50 W~300 W |
| Substrate Temperature | 250° C.~350° C. | 250° C.~350° C. |

TABLE 9

| Parameter | More Preferred Range | |
|---|---|---|
| | Step 1 | Step 2 |
| Tetra-methylsilane (TMS) flow rate | 100 sccm~500 sccm | 0 sccm~100 sccm |
| Helium (He) flow rate | 100 sccm~1000 sccm | 100 sccm~2500 sccm |
| Pressure | 300 Pa~700 Pa | 300 Pa~700 Pa |
| Primary RF Power | 350 W~500 W | 350 W~500 W |
| Secondary RF Power | 50 W~150 W | 50 W~150 W |
| Substrate Temperature | 300° C.~350° C. | 300° C.~350° C. |

Film Forming Conditions/Sequence

To deposit SiCN layer on 200 mm wafer, a reactive gas source such as tetra-methylsilane (TMS) and a substantial source of nitrogen such as ammonia (NH3) is introduced into the reaction zone. Helium can be used as an inert gas. See TABLES 1 through 3 for gas flow rates. The chamber is maintained preferably at about 300 to 700 Pa, more preferably maintained at 600 Pa. A mixed frequency of 27.12 MHz and 400 kHz RF power source preferably delivers at least about 100 Watts to 2000 Watts and at least about 50 Watts to 500 Watts respectively. More preferably 27.12 MHz RF power of 575W and 400 kHz RF power of 100W is applied for forming films.

Figure 3:
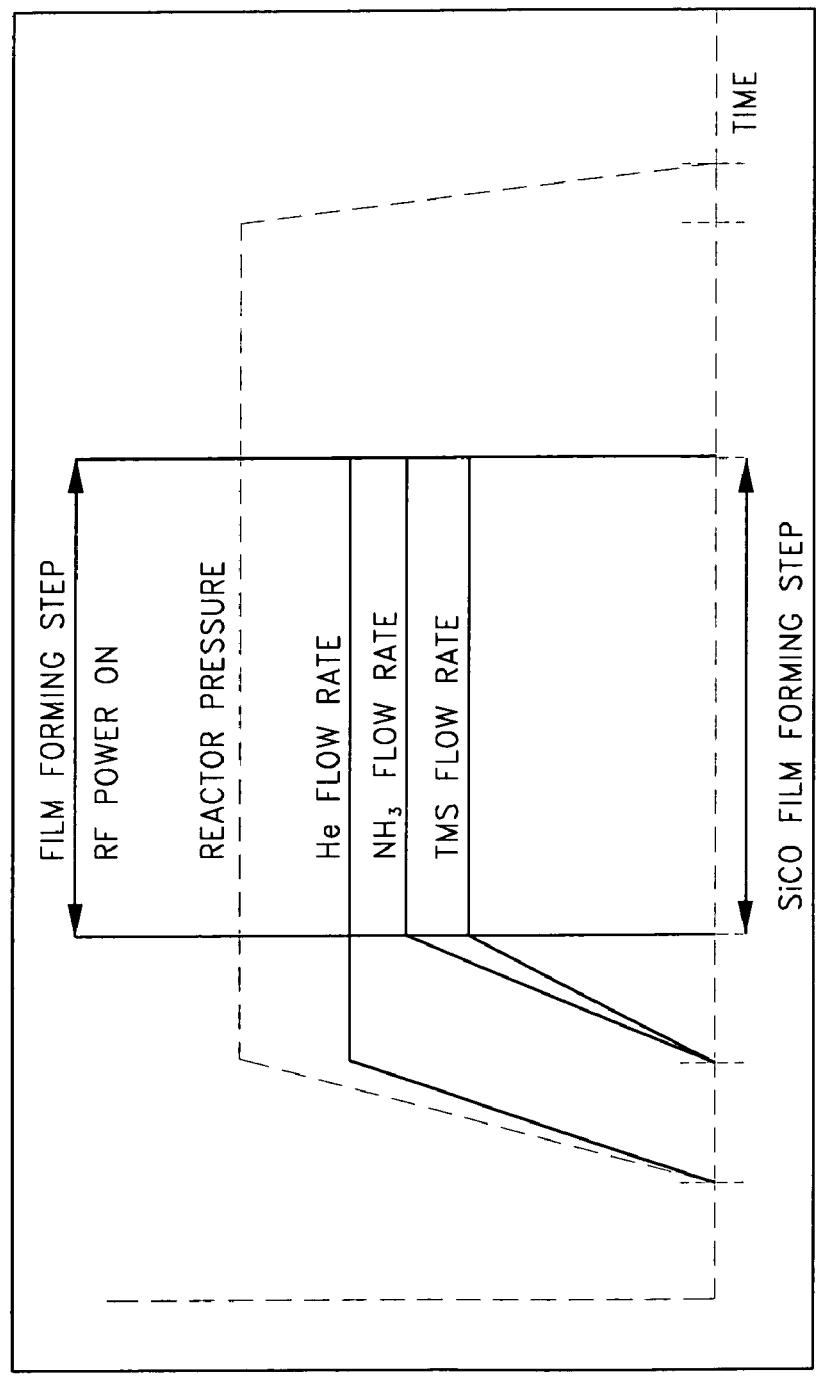
FIG. 3 illustrates an exemplary sequence (deposition recipe) for forming a SiCN film.

A basic film is formed on the substrate by flowing TMS, NH$_3$, He and applying RF power as shown in FIG. 3 (TMS=250 sccm; NH$_3$=250 sccm; He=2.5 slm; 27.12 MHz at 575W; 400 kHz at 75W; substrate temperature=365° C.; chamber pressure=600 Pa).

The basic film properties of the SiCN film deposited above are shown in TABLE 10. Furthermore, no major changes either to dielectric constant or to stress of this film were observed even when exposed to air at room temperature of 20° C. to 30° C.

SiCO Film Forming Conditions/Sequence

To deposit SiCO layer on 200 mm wafer, a reactive gas source such as tetra-methylsilane (TMS) and a substantial source of oxygen such as carbon dioxide (CO2) is introduced into the reaction zone. An inert gas such as helium is also flown into the chamber. See TABLES 4 through 6 for gas flow rates. The chamber is maintained preferably at about 300 to 700 Pa, more preferably maintained at 533 Pa. A mixed frequency of 27.12 MHz and 400 kHz RF power source preferably delivers at least about 100 Watts to 2000 Watts and at least about 50 Watts to 500 Watts respectively. More preferably 27.12 MHz RF power of 450W and 400 kHz RF power of 100W is applied for forming films.

Figure 4:
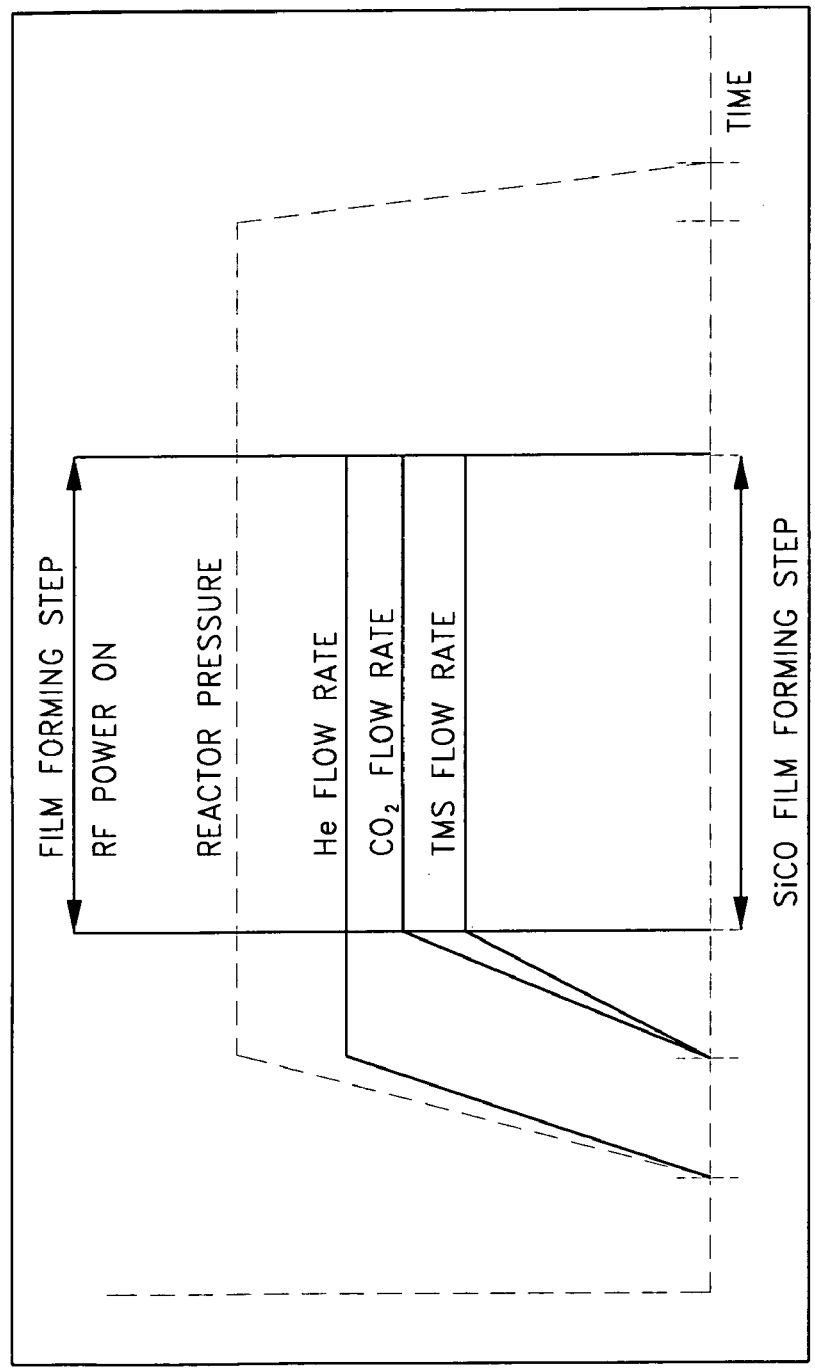
FIG. 4 illustrates an exemplary sequence (deposition recipe) for forming a SiCO film.

A basic film is formed on the substrate by flowing TMS, CO$_2$, He and applying RF power as shown in FIG. 4 (TMS=300 sccm; He=2.5 slm; CO$_2$=1.9 slm; 27.12 MHz at 450W; 400 kHz at 100W; substrate temperature=365° C.; chamber pressure=533 Pa).

The basic film properties of the SiCO film deposited above are shown in TABLE 10. Furthermore, no major changes either to dielectric constant or to stress of this film were observed even when it has direct contact to air at room temperature of 20° C. to 30° C.

SiC Film Forming Conditions/Sequence

To deposit SiC layer on 200 mm wafer, a reactive gas source such as tetra-methylsilane (TMS) is introduced into the reaction zone. Helium is used as an inert gas. See TABLES 7 through 9 for gas flow rates. The chamber is maintained preferably at about 300 to 700 Pa, more preferably maintained at 600 Pa. A mixed frequency of 27.12 MHz and 400 kHz RF power source preferably delivers at least about 100 Watts to 2000 Watts and at least about 50 Watts to 500 Watts respectively. More preferably 27.12 MHz RF power of 400W and 400 kHz RF power of 150W is applied for forming films.

Figure 5:
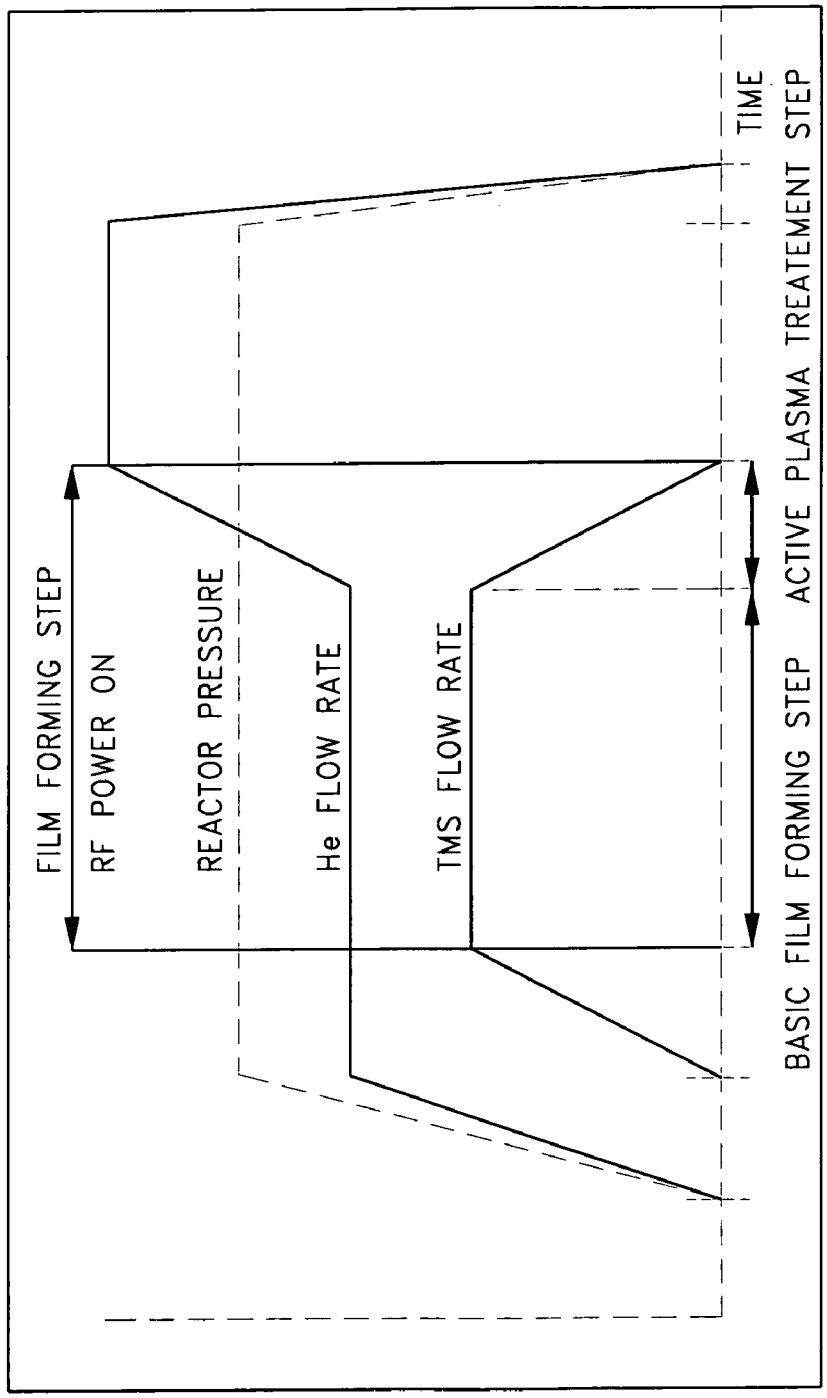
FIG. 5 illustrates an exemplary sequence (deposition recipe) for forming a SiC film.

SiC film deposition steps are divided into 2 steps. First, basic film is formed on the substrate by flowing TMS, He and applying RF power as shown in FIG. 5 (TMS=300 sccm; He=500 slm; 27.12 MHz at 400W; 400 kHz at 150W; substrate temperature=340° C.; chamber pressure=600 Pa).

Second, an active plasma treatment step is performed. After the basic film formation step, second film formation is carried out continuously. In this step, Helium flow is increased and TMS flow is decreased without changing plasma discharge. One has to consider that the film formation is continued during the active plasma treatment (TMS=Ramp down to 0 sccm; He=Ramp up to 2.5 slm; 27.12 MHz at 400W; 400 kHz at 150W; substrate temperature=340° C.; chamber pressure=600 Pa).

The basic film properties of the SiC film deposited using the above steps and conditions are shown in TABLE 10.

A SiC film deposited by the basic film forming step alone is not stable, its film stress and dielectric constant changes when exposed to air at room temperature. This is due to the oxidation of the surface layer. The method of minimizing the oxidation of carbon containing films, such as SiC is published in U.S. Patent Application Publication 2002/054962, however, no changes/improvements to the film properties are observed. Furthermore, when annealing is performed at 400° C. under nitrogen atmosphere for 10 hours, a drastic change in the film stress is observed. The change in the stress is about 400 MPa, which consequently implies to a poor thermal stress stability behavior. Due to this, a new problem arises such as a barrier insulating film and the inter dielectric layer is ready to peel off.

When an active plasma treatment in this invention is performed on the SiC films, the unstable phenomena of the film stress and dielectric constant are solved. Also the dielectric constant and leakage current is decreased. Furthermore, after annealing at 400° C. under nitrogen atmosphere for 10 hours, almost no changes to the film properties are observed, except for a small change in the film stress. It is presumed that the SiC film deposited according to the embodiments described above has a good thermal stress behavior. It can also be presumed that the active plasma treatment gives good adhesion behavior between barrier insulating film and inter dielectric layer.

The silicon carbide films deposited by the PECVD process described herein have significantly lower dielectric constant and lower leakage current in comparison to the conventional silicon carbide films. The silicon carbide films can be deposited without a mixture of low and high frequency. However, the preferred mixture of high and low radio frequency corrects adverse film properties caused by the bombardment of the silicon carbide film with molecules of inert gas. Increasing the ratio of Si—C bonds in the film provides greater hardness and high elastic modulus in the silicon carbide film.

The following examples illustrate additional preferred embodiments. In particular, the following example demonstrates deposition of nitrogen doped silicon carbide (SiCN), oxygen doped silicon carbide (SiCO), and silicon carbide (SiC) films having excellent copper diffusion barrier and etch stop properties.

Employing Pulsed RF Power During SiCN Film Forming

Figure 6A:
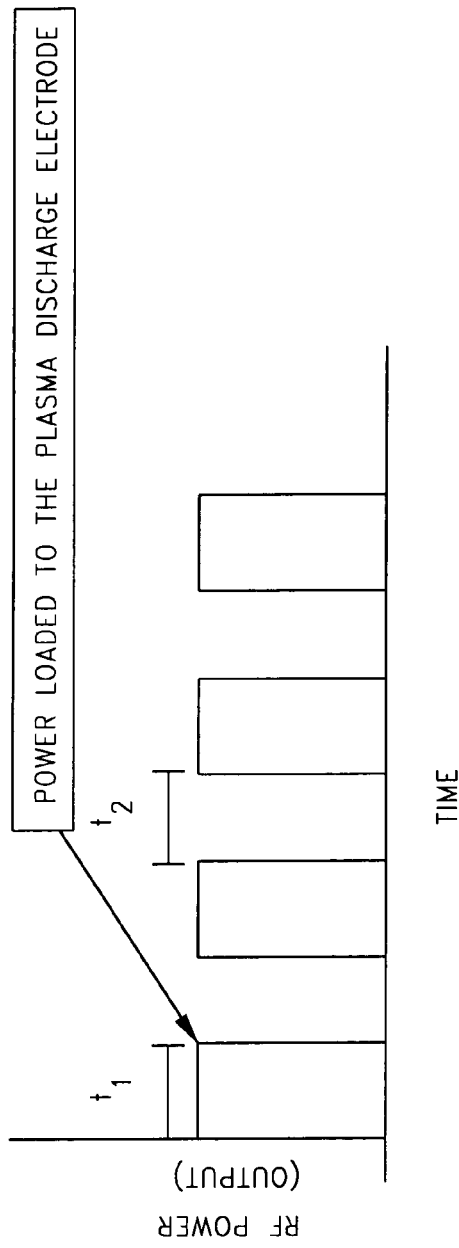
FIG. 6A illustrates an ON-OFF pulsed RF power cycle appropriate for use during formation of SiC, SiCN and SiCO films.
Figure 6B:
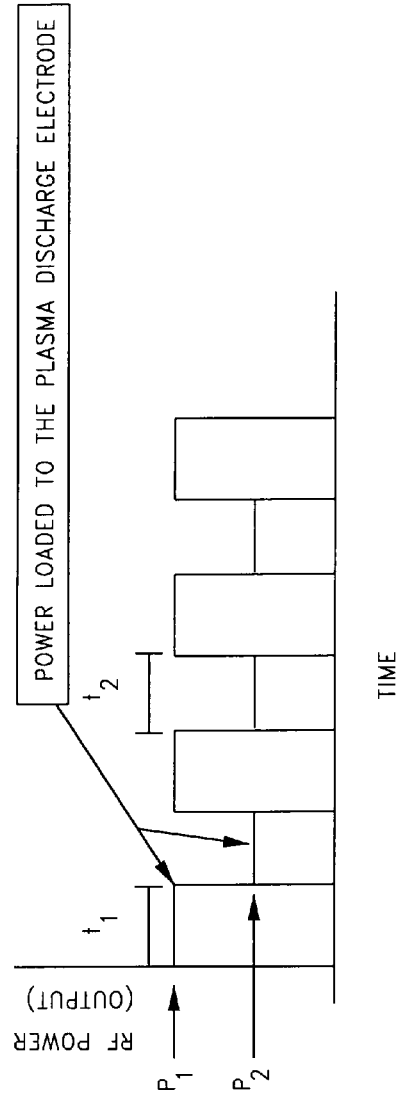
FIG. 6B illustrates a HIGH-LOW pulsed RF power cycle appropriate for use during formation of SiC, SiCN and SiCO films.

SiCN film is deposited on a 200 mm wafer by introducing tetra-methylsilane (TMS), ammonia ($NH_3$) and helium as inert gas into the reaction zone. (See TABLES 1, 2 and 3 for gas flow rates). The chamber is maintained preferably at about 300 to 700 Pa, more preferably maintained at 600 Pa. The substrate is placed on top plate, approximately 14 to 20 mm from the showerhead and 50 to 500 watts of pulsed high frequency power of 27.12 MHz, 50 to 100 Watts of 400 kHz low frequency power is applied to the showerhead for plasma enhanced deposition of SiCN films. The on-time, ($t_1$) is from 0.1 to 20 sec and off-time, ($t_2$) is from 0.1 to 10 sec. More preferably the on-time is from 0.1 to 10 sec and off-time is from 0.1 to 5 sec. The ON-OFF pulse sequence/time interval is illustrated in FIG. 6A. H-L pulse operation mode can also be employed to get the same result as the ON-OFF pulse operation mode. H refers to the high power values ($P_1$) (maximum power employed to the plasma discharge electrode during film forming), and L refers to the low power values ($P_2$) (minimum power employed to the plasma discharge electrode during film forming). H-L pulse sequence/time interval is illustrated in FIG. 6B. The film properties of the deposited SiCN such as dielectric constant, leakage current at 1 MV/cm, film stress is shown in TABLE 10.

Employing Pulsed RF Power During SiCO Film Forming

SiCO film is deposited on a 200 mm wafer by introducing tetra-methylsilane, carbon dioxide and helium as inert gas into the reaction zone. (See TABLES 4,5, and 6 for gas flow rates). The chamber is maintained preferably at about 300 to 700 Pa, more preferably maintained at 533 Pa. The substrate is placed on top plate, approximately 14 to 20 mm from the showerhead and 50 to 500 watts of pulsed high frequency power of 27.12 MHz, 50 to 100 Watts of 400 kHz low frequency power is applied to the showerhead for plasma enhanced deposition of SiCO films. The on-time ($t_1$) is from 0.1 to 20 sec and off-time ($t_2$) is from 0.1 to 10 sec. More preferably the on-time is from 0.1 to 10 sec and off-time is from 0.1 to 5 sec. The ON-OFF pulse sequence/time interval is illustrated in FIG. 6A. H-L pulse operation mode can also be employed to get the same result as the ON-OFF pulse operation mode. H refers to the high power values ($P_1$) (maximum power employed to the plasma discharge electrode), and L refers to the low power values ($P_2$) (minimum power employed to the plasma discharge electrode). H-L pulse sequence/time interval is illustrated in FIG. 6B. The film properties of the deposited SiCO such as dielectric constant, leakage current at 1 MV/cm, film stress is shown in TABLE 10.

Employing Pulsed RF Power During SiC Film Forming

SiC film is deposited on a 200 mm wafer by introducing tetra-methylsilane and helium as inert gas into the reaction zone. (See TABLES 7,8 and 9 for gas flow rates). The chamber is maintained preferably at about 300 to 1000 Pa, more preferably maintained at 600 Pa. The substrate is placed on top plate, approximately 14 to 20 mm from the showerhead and 50 to 500 watts of pulsed high frequency power of 27.12 MHz, 50 to 100 Watts of 400 kHz low frequency power is applied to the showerhead for plasma enhanced deposition of SiC films. The on-time ($t_1$) is from 0.1 to 20 sec and off-time ($t_2$) is from 0.1 to 10 sec. More preferably the on-time is from 0.1 to 10 sec and off-time is from 0.1 to 5 sec. The ON-OFF pulse sequence/time interval is illustrated in FIG. 6A. H-L pulse operation mode can also be employed to get the same result as the ON-OFF pulse operation mode. H refers to the high power ($P_1$) (maximum power employed to the plasma discharge electrode) values, and L refers to the low power values ($P_2$) (minimum power employed to the plasma discharge electrode). H-L pulse sequence/time interval is illustrated in FIG. 6B. The film properties of the deposited SiC such as dielectric constant, leakage current at 1 MV/cm, film stress is shown in TABLE 10.

Figure 2:
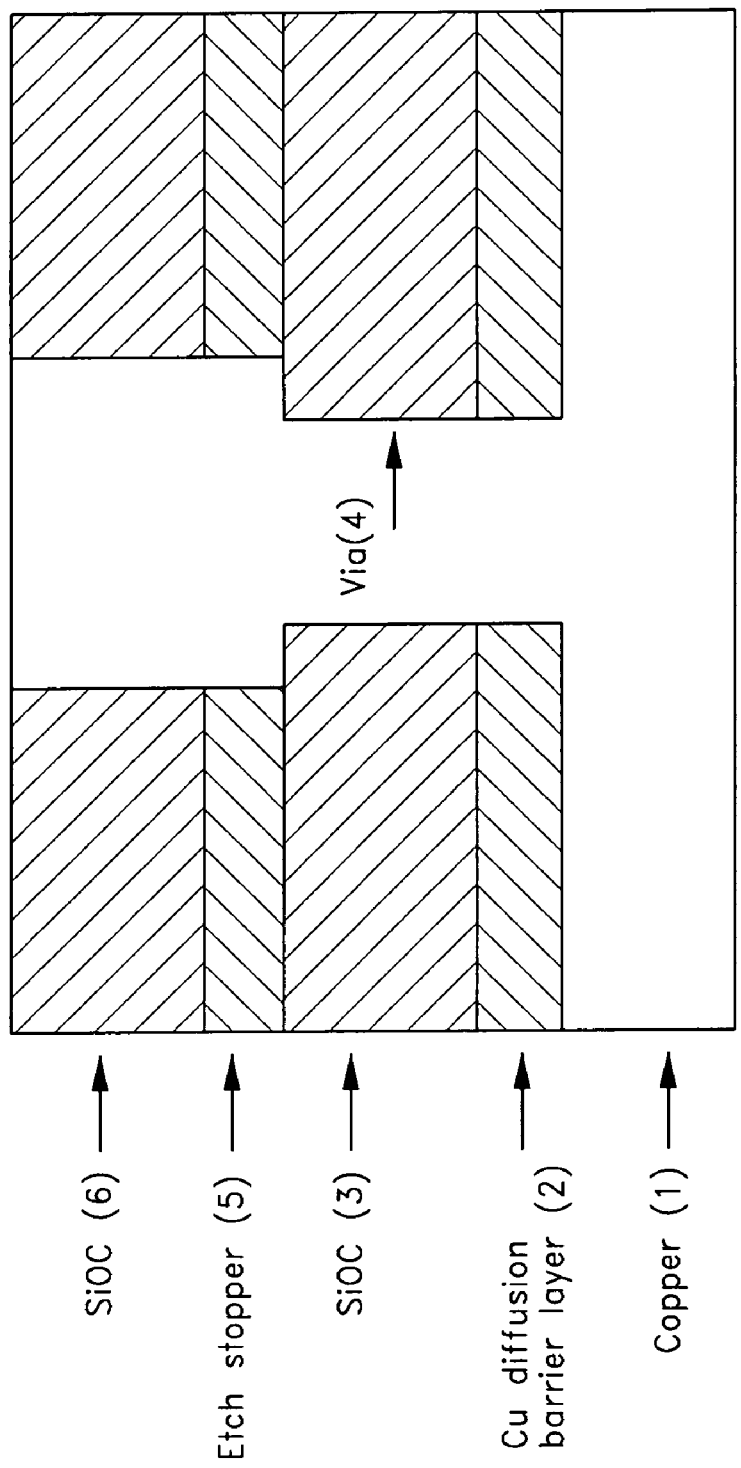
FIG. 2 illustrates a dual damascene structure in which a silicon carbide layer can be used.

FIG. 2 shows a dual damascene structure in which a silicon carbide layer can be used. A copper (Cu) layer (1) is first covered with a silicon carbide Dielectric Diffusion Barrier (DDB) (2). Before depositing the DDB, the Cu surface can be improved by removing of any copper oxide that may be remaining on the surface. Typically a hydrogen ($H_2$) or an ammonia ($NH_3$) or methane ($CH_4$) plasma based reduction is used before the deposition of DDB (2). This copper surface reduction to remove CMP residue can be performed in a PECVD chamber.

On top of Cu (1), the silicon carbide DDB layer (2) is deposited. After the deposition of DDB layer (2), inter level dielectric, in this case SiOC layer (3), is deposited. The thickness of SiOC layer (3) is approximately the height of via (4). SiOC layer (3) is patterned and etched to create via hole. The portion of DDB layer (2) over via hole is also etched to expose the underlying metal line. A silicon carbide etch stop layer (5) is deposited over SiOC layer (3), where the thickness of SiOC layer (3) is approximately the height of via (4). SiOC layer (3) is patterned and etched to create the via hole. The portion of DDB layer (2) over via hole is also etched to expose the underlying metal line. A silicon carbide etch stop layer (5) is deposited over SiOC layer. Then second SiOC layer (6) is deposited. Etching and patterning the second SiCO layer (6) creates the trench. Silicon carbide etch stop layer (5) prevents the etching of second SiOC layer (6) from continuing into first SiOC layer (3).

A silicon carbide layer can also be deposited as a passivation layer (not shown) for protecting the device from scratching. The silicon carbide dielectric diffusion barrier (DDB) layer is important as it effectively prevents copper diffusion into the SiOC layers. This is due to the DDB layer having a low leakage current.

The amount of leakage current of conventional silicon carbide barrier layer at 1 MV/cm is approximately $1 \times 10^{-7}$ A/cm$^2$ compared to that of approximately $1 \times 1^{-9}$ A/cm$^2$ in a silicon carbide barrier layer fabricated as described herein. Thus, using a conventional silicon carbide barrier layer, as opposed to a silicon carbide layer fabricated as described herein, at an electric field of 2 MV/cm, maintains the same effectiveness in preventing the copper diffusion. Furthermore, the resulting silicon carbide layer has a relatively low dielectric constant, typically around 3.5 and 4.0, depending on the mixture and ratio of low frequency to the total frequency generated during deposition, and also depending on the ratio of gases used to form the silicon carbide.

The same method can be employed to deposit a nitrogen doped silicon carbide and oxygen doped silicon carbide. As a result, both the nitrogen doped silicon carbide and oxygen doped silicon carbide deposited by the PECVD process in this invention have a lower leakage current in comparison to the conventional nitrogen doped silicon carbide and the conventional oxygen doped silicon carbide respectively. Similar to silicon carbide films, the leakage current -in the resulting nitrogen doped silicon carbide films and in oxygen doped silicon carbide films are related to the carbon concentration, to the amount of inert gas introduced and to the pulse operation of the RF generator during deposition.

An as-deposited silicon carbide layer has a dielectric constant and leakage current at 1 MV/cm less than about 4.0 and $1 \times 10^{-9}$ A/cm$^2$, respectively, making it suitable for use as an insulating material in integrated circuits. The dielectric constant of the silicon carbide layer is tunable, in that it can be varied as a function of the ratio of the mixed frequency RF powers. In particular, as the ratio of the low frequency RF power to the total mixed powers decreases, the dielectric constant of the silicon carbide layer also decreases.

The dielectric constant of the silicon carbide layer can also be tuned as a function of the composition of the gas mixture during layer formation. As the carbon concentration in the gas mixture increases, the carbon content of the as-deposited silicon carbide layer increases, making the silicon carbide film less dense and dielectric constant decrease. Also, as the carbon concentration of the as deposited silicon carbide layer increases, the hydrophobic properties thereof increases making such layers suitable for use as moisture barriers in integrated circuits.

Furthermore, the leakage current and dielectric constant of the silicon carbide layer in this invention has decreased by invoking a pulse operation to the RF power. The on-time ($t_1$) is from 0.1 to 20 sec and off-time ($t_2$) is from 0.1 to 10 sec. Most preferably the on-time is from 0.1 to 10 sec and off-time is from 0.1 to 5 sec. The ON-OFF pulse sequence/time interval is illustrated in FIG. 6A. H-L pulse operation mode can also be employed to get the same result as the ON-OFF pulse operation mode. H refers to the high power values (P1) (maximum power employed to the plasma discharge electrode), and L refers to the low power values (P2) (minimum power employed to the plasma discharge electrode). H-L pulse sequence/time interval is illustrated in FIG. 6B. The film properties of the deposited SiC such as dielectric constant, leakage current at 1 MV/cm, film stress is shown in TABLE 10.

Figure 7:
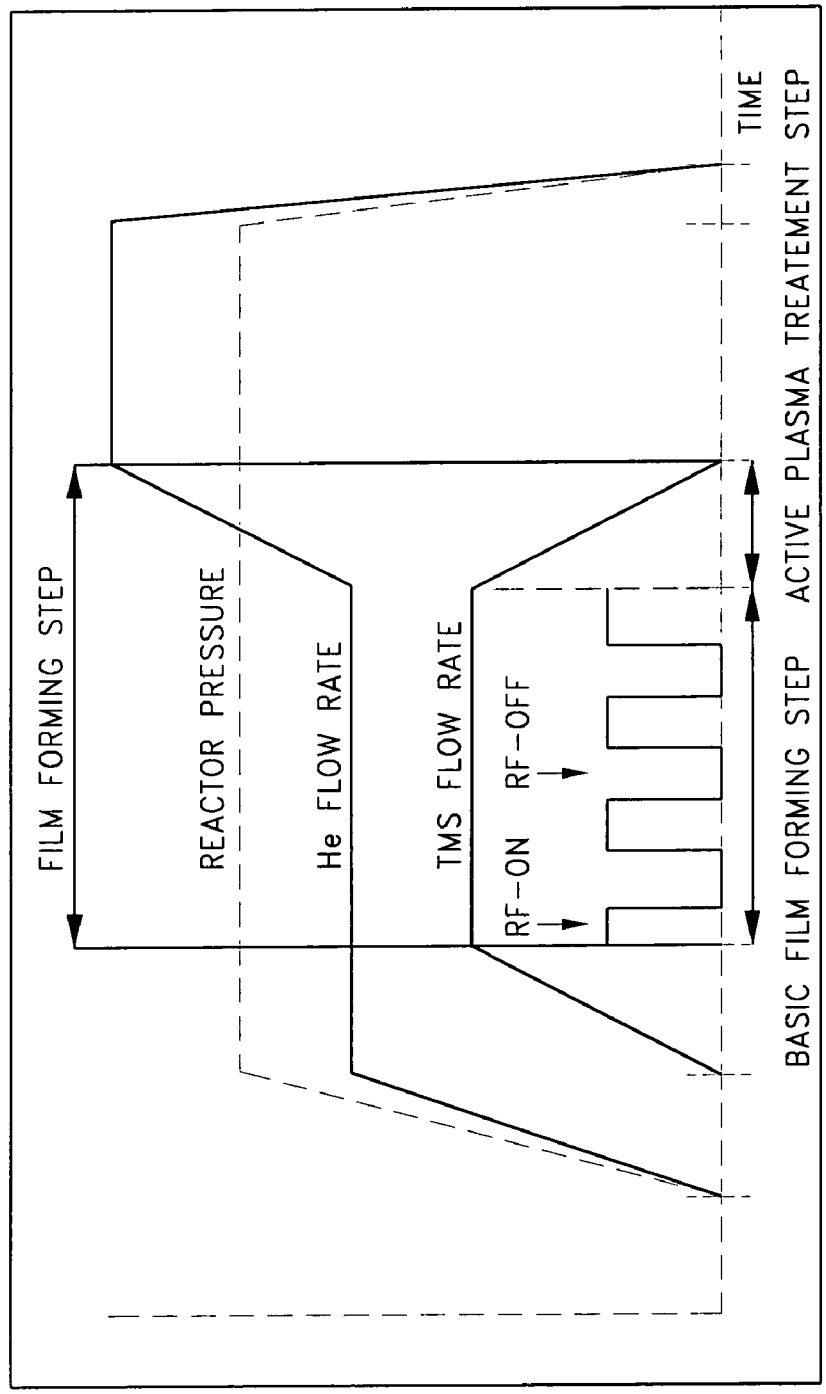
FIG. 7 illustrates a non-continuous deposition technique used in the creation of SiC films.

Also, similar results can be obtained by introducing a non-continuous deposition method. "Non-continuous deposition" refers to turning the plasma on and off randomly by turning the RF power on and off as shown in FIG. 7.

In addition, the as-deposited silicon carbide layer has no oxygen content. It is believed that such an oxygen free silicon carbide layer minimizes metal diffusion and improves the barrier layer properties. For example, the as-deposited silicon carbide layer has a current blocking ability at 1 MV/cm that is less than that about $1 \times 10^{-9}$ A/cm$^2$, which is suitable for minimizing cross-talk between integrated circuit interconnect structures.

The etching performance of silicon carbide, nitrogen doped silicon carbide and oxygen doped silicon carbide materials shows that the etch selectivity, based on RIE (reactive ion etching) etching mode, between SiOC and silicon carbide described herein was from 5 to 15. The etch selectivity between SiOC and nitrogen doped silicon carbide described herein was from 4 to 5. The etch selectivity between SiOC and oxygen doped silicon carbide described herein was from 4 to 10. Superior performance exists for SiCN, SiCO and SiC on etching selectivity.

TABLE 10

| Film type | Film Stress Compressive (MPa) | Dielectric constant | Leakage current at 1 MV/cm Without pulse energy | With pulse energy |
|---|---|---|---|---|
| SiCN | 240 to 260 | 4.5 | $2 \times 10^{-9}$ | $3 \times 10^{-10}$ |
| SiCO | 230 to 250 | 4.3 | $3 \times 10^{-9}$ | $4 \times 10^{-10}$ |
| SiC | 50 to 100 | 3.8 | $3 \times 10^{-8}$ | $1 \times 10^{-9}$ |

What is claimed is:

1. A method comprising:
   depositing a silicon carbide layer onto a substrate in a chemical vapor deposition process that comprises:
   providing a silicon and carbon source gas and an inert gas into a reaction zone, the reaction zone containing the substrate;
   producing an electric field in the reaction zone, the electric field comprising a mixture of low and high frequency radiofrequency ("RF") energy produced by an RF power supply, the RF power supply generating an average power at an electrode surface used for plasma discharge in the reaction zone, wherein the RF power supply is configured to pulse the average power at the electrode surface between a high average power state and a low average power state; and
   reacting the silicon and carbon source gas to deposit a silicon carbide layer on the substrate.

2. The method of claim 1, wherein:
   the high frequency RF energy has a frequency between about 27.12 MHz and about 30 MHz, and has a power between about 200 watts and about 1000 watts; and
   the low frequency RF energy has a frequency between about 100kHz and about 500 kHz, and has a power between about 50 watts and 500 watts.

3. The method of claim 2, wherein the low frequency RF energy has a frequency between about 300 kHz and about 450 kHz.

4. The method of claim 1, wherein the average power at the electrode surface in the high average power state is between about 200 watts and about 1000 watts, and the average power at the electrode surface in the low average power state is less than or equal to 20% of the average power in the high average power state.

5. The method of claim 1, wherein the silicon and carbon source gas is one of the following: tri-methylsilane, tetra-methylsilane, or divinyl-dimethylsilane.

6. The method of claim 1, wherein the inert gas is one of the following: helium, argon or krypton.

7. The method of claim 1, wherein a volume flow rate ratio of the silicon and carbon source gas to the inert gas is between about 1:1 and about 1:15.

8. The method of claim 1, wherein the silicon and carbon source gas is provided into the reaction zone at a rate between about 200 sccm and about 500 sccm.

9. The method of claim 1, wherein the substrate is heated to a temperature between about 200° C. and about 400° C. during deposition of the silicon carbide layer.

10. The method of claim 9, wherein the substrate is heated to a temperature between about 320° C. and about 350° C. during deposition of the silicon carbide layer.

11. The method of claim 1, wherein the reaction zone is maintained at a pressure between about 300 Pa and about 1000 Pa during deposition of the silicon carbide layer.

12. The method of claim 11, wherein the reaction zone is maintained at a pressure between about 500 Pa and about 700 Pa during deposition of the silicon carbide layer.

13. The method of claim 1, wherein the silicon carbide layer has a dielectric constant less than about 4.0.

14. The method of claim 1, wherein the silicon carbide layer is oxygen-doped, and wherein the oxygen-doped silicon carbide layer has a dielectric constant less than about 4.5.

15. The method of claim 1, wherein the silicon carbide layer is nitrogen-doped, and wherein the nitrogen-doped silicon carbide layer has a dielectric constant less than about 4.5.

16. The method of claim 1, wherein the silicon carbide layer has a compressive film stress.

17. The method of claim 4, wherein the average power at the electrode surface in the row average power state is approximately 0% of the average power in the high average power state.

18. The method of claim 1, wherein the high average power state has a duration between about 0.1 seconds and about 20 seconds, and the low average power state has a duration between about 0.1 seconds and about 10 seconds.

19. A method comprising:
    depositing a silicon carbide layer onto a substrate in a chemical vapor deposition process that comprises:
        providing a silicon and carbon source gas and an inert gas into a reaction zone, the reaction zone containing the substrate;
        producing an electric field in the reaction zone, the electric field comprising a mixture of low and high frequency radio frequency ("RF") energy produced by an RF power supply, the RF power supply generating an average power at an electrode surface used for plasma discharge in the reaction zone, wherein (a) the RF power supply is configured to pulse the average power at the electrode surface between a high average power state and a low average power state and (b) the mixture of low and high frequency RF energy has a ratio of low frequency RF power to total RF power of less than about 0.5; and
        reacting the silicon and carbon source gas to deposit a silicon carbide layer on the substrate.

\* \* \* \* \*

UNITED STATES PATENT AND TRADEMARK OFFICE
CERTIFICATE OF CORRECTION

PATENT NO.         : 7,238,393 B2                                          Page 1 of 1
APPLICATION NO. : 10/414467
DATED              : July 3, 2007
INVENTOR(S)        : Kamal Kishore Goundar et al.

It is certified that error appears in the above-identified patent and that said Letters Patent is hereby corrected as shown below:

At Column 11, Line 17: Please delete "$1x1^{-9}$" and insert -- $1x10^{-9}$ --, therefor.

At Column 11, Line 35: Please delete "current -in" and insert -- current in --, therefor.

At Column 14, Line 9: In Claim 17, please delete "row" and insert -- low --, therefor.

Signed and Sealed this

Thirteenth Day of November, 2007

JON W. DUDAS
*Director of the United States Patent and Trademark Office*